United States Patent
Furukawa

(10) Patent No.: US 12,165,897 B2
(45) Date of Patent: Dec. 10, 2024

(54) WORKPIECE HOLDING TOOL

(71) Applicant: KYOCERA Corporation, Kyoto (JP)

(72) Inventor: Naoki Furukawa, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 239 days.

(21) Appl. No.: 17/777,890

(22) PCT Filed: Nov. 10, 2020

(86) PCT No.: PCT/JP2020/041937
§ 371 (c)(1),
(2) Date: May 18, 2022

(87) PCT Pub. No.: WO2021/106554
PCT Pub. Date: Jun. 3, 2021

(65) Prior Publication Data
US 2022/0415691 A1    Dec. 29, 2022

(30) Foreign Application Priority Data
Nov. 25, 2019   (JP) .................................. 2019-212439

(51) Int. Cl.
*H01L 21/683*    (2006.01)

(52) U.S. Cl.
CPC ...... *H01L 21/6833* (2013.01); *H01L 21/6831* (2013.01)

(58) Field of Classification Search
CPC ............. H01L 21/6833; H01L 21/6831; H01L 21/683; H01J 37/3244; H01J 37/32449; H01J 37/32715; H01J 37/32724; H01J 37/32568; H02N 13/00
USPC .......................................................... 361/234
See application file for complete search history.

(56) References Cited

U.S. PATENT DOCUMENTS

| | | | | |
|---|---|---|---|---|
| 5,720,818 A | * | 2/1998 | Donde | C23C 16/4586 118/728 |
| 2005/0105243 A1 | | 5/2005 | Lee et al. | |
| 2009/0034147 A1 | * | 2/2009 | Narendrnath | H01L 21/6831 279/128 |
| 2010/0109263 A1 | | 5/2010 | Jun et al. | |
| 2010/0193130 A1 | * | 8/2010 | Kawakami | H01L 21/6831 156/345.37 |
| 2016/0276198 A1 | | 9/2016 | Anada et al. | |

FOREIGN PATENT DOCUMENTS

| | | |
|---|---|---|
| JP | 2014-209615 A | 11/2014 |
| KR | 20050047148 A1 | 5/2005 |
| KR | 20100051000 A1 | 5/2010 |

* cited by examiner

*Primary Examiner* — Danny Nguyen
(74) *Attorney, Agent, or Firm* — Volpe Koenig

(57) ABSTRACT

A workpiece holding tool includes a substrate, a base, and a cylindrical member. The base includes a gas flow channel including a first portion and a second portion. The first portion extends parallel to a bonding surface of the base. The second portion forms branch connection with the first portion and extends perpendicularly to the bonding surface to be open in the bonding surface. The cylindrical member includes a cylindrical body portion located along the second portion and a cylindrical extension portion continuous with the body portion and extending to the first portion.

5 Claims, 5 Drawing Sheets

WORKPIECE HOLDING TOOL

FIELD

The present disclosure relates to a workpiece holding tool for holding a workpiece such as a semiconductor wafer in manufacturing processes of semiconductor integrated circuits or liquid crystal displays.

BACKGROUND

A known technique is described in, for example, Patent Literature 1.

CITATION LIST

Patent Literature

Patent Literature 1: Japanese Unexamined Patent Application Publication No. 2014-209615

BRIEF SUMMARY

A workpiece holding tool according to an aspect of the present disclosure includes a substrate having a plate, and including a workpiece holding surface, and a base including a bonding surface bonded to a back surface of the substrate opposite to the workpiece holding surface. The base includes a flow channel extending to the bonding surface. The flow channel includes a first portion and a second portion. The first portion extends parallel to the bonding surface of the base. The second portion forms a branch connection with the first portion, includes an opening at the bonding surface, and extends in a direction perpendicularly to the bonding surface. The workpiece holding tool includes a cylindrical member including a body portion being cylindrical and an extension portion being cylindrical. The body portion is located along the second portion. The extension portion is continuous with the body portion and extends to the first portion.

BRIEF DESCRIPTION OF DRAWINGS

The objects, features, and advantages of the present disclosure will become more apparent from the following detailed description and the drawings.

DETAILED DESCRIPTION

A workpiece holding tool with the structure that forms the basis of a workpiece holding tool according to one or more embodiments of the present disclosure is used in, for example, a semiconductor manufacturing apparatus. The workpiece holding tool includes a substrate for placing and holding a workpiece such as a wafer and a base for supporting the substrate. The substrate is formed from an insulator. The base is formed from a conductor such as metal. The substrate and the base are bonded together with a bond.

The substrate and the base are integrally bonded together to define an internal flow channel for externally supplying a plasma generating gas, such as helium, onto the upper surface of the substrate that serves as a workpiece holding surface.

A known workpiece holding tool used in, for example, a semiconductor manufacturing apparatus includes an electrostatic chuck described in Patent Literature 1. The electrostatic chuck described in Patent Literature 1 includes a dielectric substrate including inner electrodes and a metal base plate. The electrostatic chuck has through-holes extending through the dielectric substrate and the base plate. Each through-hole in the base plate receives a ceramic porous member. To prevent electric discharge in plasma processing of a workpiece, the structure in Patent Literature 1 includes such a ceramic porous member placed in each through-hole in the base plate to improve insulation.

For miniaturization of recent semiconductor integrated circuits, higher power plasma may be used on workpieces. With a known workpiece holding tool, such higher power plasma to irradiate a workpiece can discharge electrically in a flow channel in a base (base plate) with a plasma generating gas filling the flow channel.

A cylindrical ceramic member may be placed along the through-hole in the base to improve insulation and reduce such electric discharge. However, electric discharge in the base may not be reduced when still higher power plasma is used.

Figure 1:
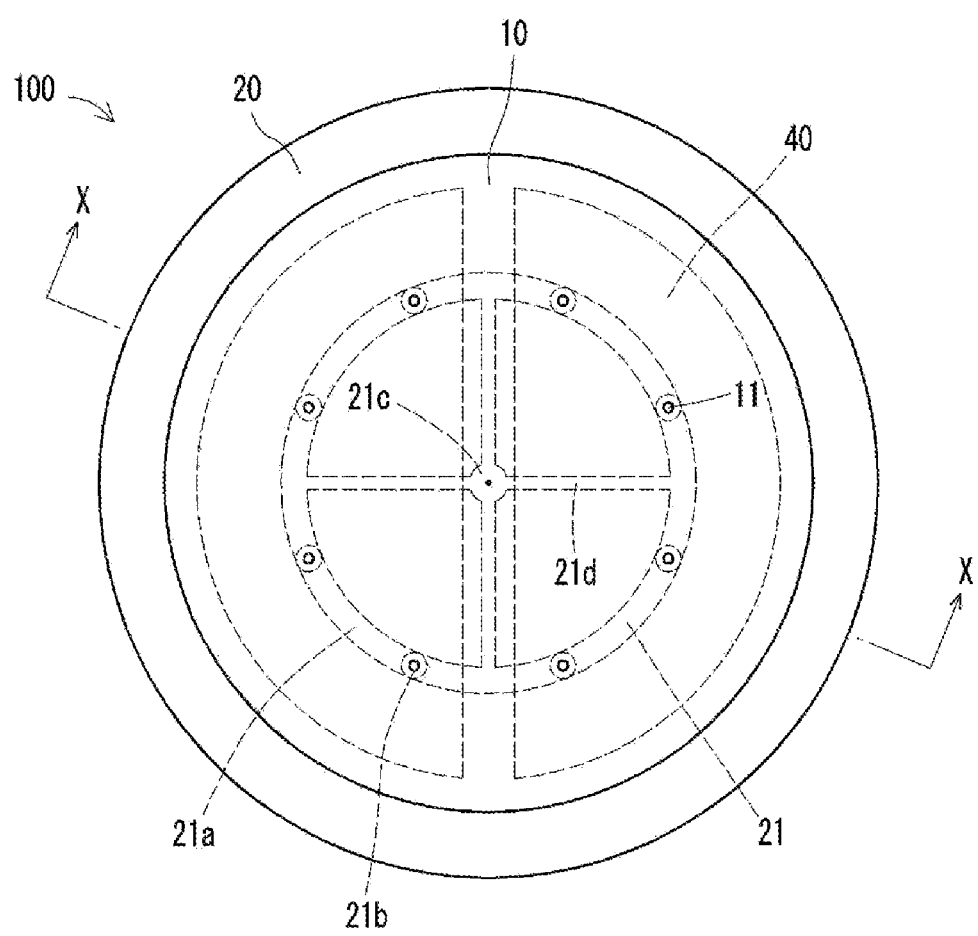
FIG. 1 is a plan view of a workpiece holding tool according to a first embodiment.
Figure 2:
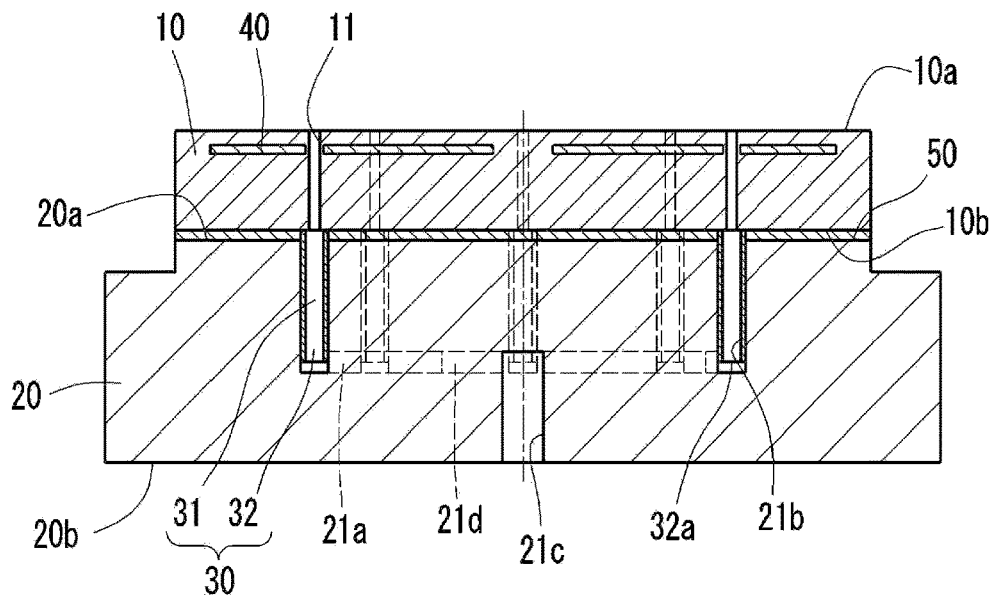
FIG. 2 is a cross-sectional view of the workpiece holding tool taken along line X-X in FIG. 1.

One or more embodiments of the present disclosure will now be described with reference to the drawings. FIG. 1 is a plan view of a workpiece holding tool according to a first embodiment. FIG. 2 is a cross-sectional view of the workpiece holding tool taken along line X-X in FIG. 1. A workpiece holding tool 100 includes a substrate 10, a base 20, and cylindrical members 30.

The substrate 10 is a ceramic member having a first surface 10a and a second surface 10b opposite to the first surface 10a. The first surface 10a serves as a workpiece holding surface that holds a workpiece. The second surface 10b is a back surface that is bonded to the base 20. The substrate 10 is a plate with any outer shape that may be circular or rectangular.

The substrate 10 is formed from, for example, a ceramic material. Examples of the ceramic material include alumina, aluminum nitride, silicon nitride, and yttria. The substrate 10 may have outer dimensions including a diameter (or side length) of 200 to 500 mm and a thickness of 2 to 15 mm.

Various methods can be used for holding a workpiece with the substrate 10. The workpiece holding tool 100 according to the present embodiment may be an electrostatic chuck that holds a workpiece with static electricity. The workpiece holding tool 100 includes an attraction electrode 40 in the substrate 10. The attraction electrode 40 include two electrodes, one connected to the positive electrode of a power supply, and the other connected to the negative electrode of the power supply. The two electrodes are substantially semicircular and are located inside the substrate 10 with their straight edges abutting each other. The attraction electrode 40 combining these two electrodes has an entirely circular outer shape. The circular outer shape of the attraction electrode 40 can be coaxial with the circular outer shape of the ceramic member. The attraction electrode 40 may contain a metal material. Examples of the metal material include platinum, tungsten, and molybdenum.

The workpiece holding tool 100 uses plasma generated above the first surface 10a of the substrate 10, which serves as the workpiece holding surface. The plasma may be generated by, for example, applying radio-frequency (RF) waves between multiple external electrodes and exciting the gas between the electrodes. The supply of the plasma generating gas will be described later.

The base 20 is formed from metal. The base 20 supports the substrate 10. The metal material may be aluminum. The base 20 may have any outer shape that may be circular or rectangular. The base 20 may have outer dimensions including a diameter (or side length) of 200 to 500 mm and a thickness of 10 to 100 mm. The base 20 may have the same outer shape and dimensions as or a different outer shape and dimensions from the substrate 10.

The base 20 and the substrate 10 are bonded together with a bonding layer 50. More specifically, the first surface 20a of the base 20 is a bonding surface facing the second surface 10b of the substrate 10. The first surface 20a of the base 20 and the second surface 10b of the substrate 10 are bonded together with the bonding layer 50. The bonding layer 50 may be, for example, a resin adhesive. The resin material may be a silicone resin.

The base 20 includes a gas flow channel 21 extending at least to the first surface 20a that serves as the bonding surface. The gas flow channel 21 has a first portion 21a and second portions 21b. The first portion 21a extends parallel to the bonding surface 20a of the base 20. Each second portion 21b forms branch connection with the first portion 21a, and extends in a direction perpendicular to the bonding surface 20a to be open in the bonding surface 20a. The first portion 21a is, for example, in a circular shape concentric with the bonding surface 20a. For example, the second portion 21b forms branch connection with the first portion 21a. The second portion 21b is a vertical hole extending from the first portion 21a to the bonding surface 20a. The gas flow channel 21 includes a third portion 21c and a fourth portion 21d. The third portion 21c is open in the second surface 20b of the base 20 and extends in the direction perpendicular to the bonding surface 20a. The fourth portion 21d extends parallel to the bonding surface 20a of the base 20 to connect the third portion 21c and the first portion 21a. The third portion 21c is, for example, a vertical hole at the center of the bonding surface 20a. The fourth portion 21d extends along a straight line outward from the center of the bonding surface 20a. The fourth portion 21d is parallel to the bonding surface 20a.

The substrate 10 has through-holes 11 extending from the first surface 10a to the second surface 10b. The through-holes 11 in the substrate 10 each communicate with the corresponding second portion 21b of the base 20. The plasma generating gas externally flows into the third portion 21c and passes through the fourth portion 21d and reaches the first portion 21a. The plasma generating gas passes through the first portion 21a circumferentially and travels upward in the second portions 21b and reaches the first surface 20a. The plasma generating gas further flows into the through-holes 11 in the substrate 10 communicating with the second portions 21b and travels upward in the through-holes 11. The plasma generating gas is then supplied onto the first surface 10a of the substrate 10 through an opening in the first surface 10a of the substrate 10. The plasma generating gas may be helium.

The gas flow channel 21 is located in the metal base 20. In plasma processing, plasma reaching the second portions 21b through the plasma generating gas in the through-holes 11 in the substrate 10 can discharge onto an inner wall of each second portion 21b. To reduce such electric discharge, the workpiece holding tool 100 includes the cylindrical members 30 formed from an insulating material. Each cylindrical member 30 in the present embodiment includes a cylindrical body portion 31 located along the second portion 21b and a cylindrical extension portion 32 continuous with the body portion 31 to extend to the first portion 21a. The cylindrical member 30 in the present embodiment is a cylinder including the body portion 31 and the extension portion 32 integral with each other. The cylindrical member 30 covers an inner peripheral surface of the second portion 21b. The cylindrical member 30 has a distal end 32a protruding into the first portion 21a. The extension portion 32 included in the cylindrical member 30 also partially covers an inner peripheral surface of the first portion 21a. This can reduce electric discharge in the second portion 21b as well as in the first portion 21a in the base 20 when still higher power plasma is used.

A space is left between the distal end 32a of the extension portion 32 and the bottom surface of the first portion 21a. The plasma generating gas in the gas flow channel 21 in the present embodiment passes through the first portion 21a circumferentially and flows into each cylindrical member 30 from the distal end 32a of the extension portion 32. The gas then travels upward in the cylindrical member 30 to flow into the corresponding through-hole 11 in the substrate 10.

The cylindrical member 30 may be formed from, for example, a ceramic material. Examples of the ceramic material include alumina and aluminum nitride.

Figure 3A:
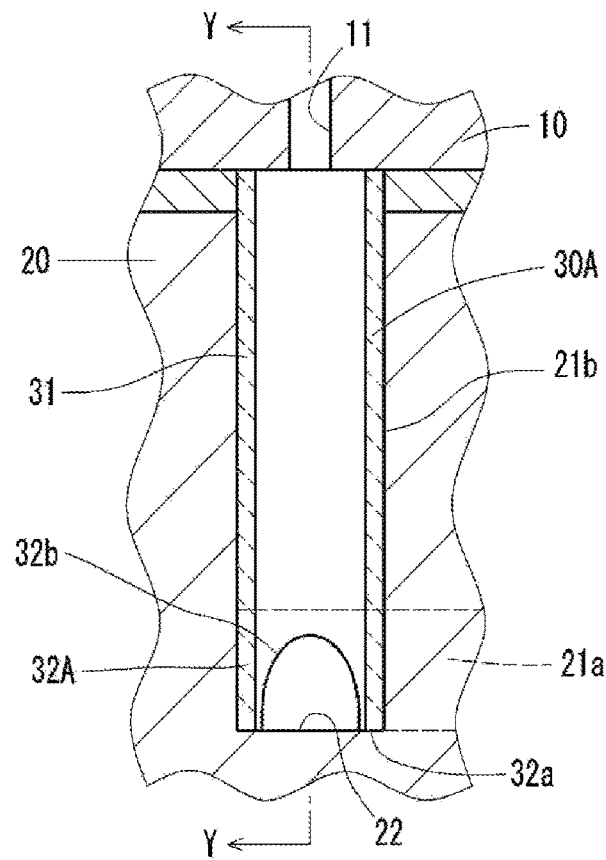
FIG. 3A is an enlarged cross-sectional view of an area including a second portion in a second embodiment.
Figure 3B:
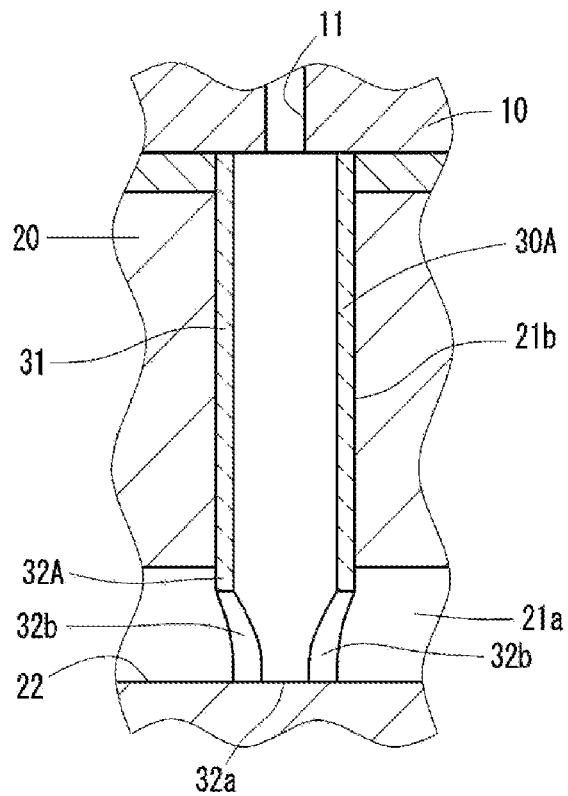
FIG. 3B is an enlarged cross-sectional view of the second portion taken along line Y-Y in FIG. 3A.

A second embodiment will now be described. FIG. 3A is an enlarged cross-sectional view of an area including a second portion according to the second embodiment. FIG. 3B is an enlarged cross-sectional view of the second portion taken along line Y-Y in FIG. 3A. The present embodiment is the same as the first embodiment except the structure of a cylindrical member 30A. The same components as in the first embodiment are given the same reference numerals and will not be described. The cylindrical member 30A in the present embodiment includes an extension portion 32A with a distal end 32a reaching a bottom surface 22 of the first portion 21a. With the distal end 32a thus being covered, the extension portion 32A has a through-hole or cutouts to allow communication between the internal space of the extension portion 32A and the first portion 21a of the gas flow channel 21.

In the present embodiment, the extension portion 32A has cutouts 32b in its peripheral wall. The extension portion 32A has two cutouts 32b with the central axis of the extension portion 32A between them to allow the plasma generating gas to flow through the annular first portion 21a. For example, the gas flows through the first portion 21a from the right of FIG. 3B and flows into an inner space of the extension portion 32A through the right cutout 32b. The gas then partially travels upward in the internal space of the extension portion 32A and partially flows into the first portion 21a through the left cutout 32b. The gas flowing into the first portion 21a then flows into the adjacent extension portion 32A.

In the present embodiment, the extension portion 32A reaches the bottom surface 22 of the first portion 21a. The structure thus covers a larger area of the inner peripheral surface of the first portion 21a than in the first embodiment, further reducing electric discharge in the first portion 21a.

The cutout 32b may have any shape and size. For example, the cutout 32b may partially be a circle (including an oval) such as a semicircle, or a polygon including a rectangle. The extension portion 32 may have a through-hole. The through-hole may have any shape and size. For example, the through-hole may be a circle (including an oval) or a polygon including a rectangle.

Figure 4:
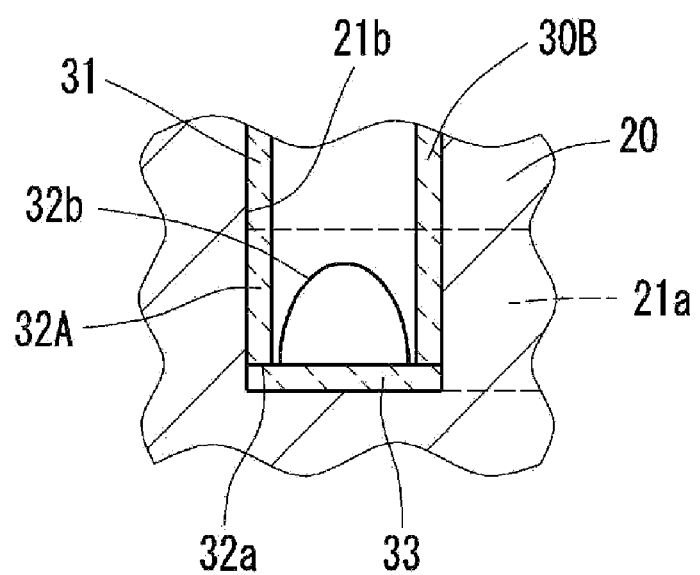
FIG. 4 is an enlarged cross-sectional view of an area including an extension portion in a third embodiment.

A third embodiment will now be described. FIG. 4 is an enlarged cross-sectional view of an area including an extension portion in the third embodiment. The present embodiment is the same as the second embodiment except the structure of a cylindrical member 30B. The same components as in the second embodiment are given the same reference numerals and will not be described. The cylindrical member 30B in the present embodiment further includes a bottom portion 33 that covers a distal end 32a of an extension portion 32A. The bottom portion 33 may be formed from any insulating material that is the same material as or a different material from the body portion 31 and the extension portion 32.

The bottom portion 33 closes the distal end 32a of the extension portion 32A and covers the bottom surface of the first portion 21a. The extension portion 32A has the same structure as in the second embodiment. The extension portion 32A thus has a through-hole or cutouts. This structure allows the plasma generating gas to flow through the first portion 21a and the extension portion 32 in the same manner as in the second embodiment, although the bottom portion 33 covers the distal end 32a of the extension portion 32A. The bottom portion 33 also covers the bottom surface 22 of the first portion 21a. The structure thus covers a larger area of the inner peripheral surface of the first portion 21a than in the second embodiment, further reducing electric discharge in the first portion 21a.

Figure 5:
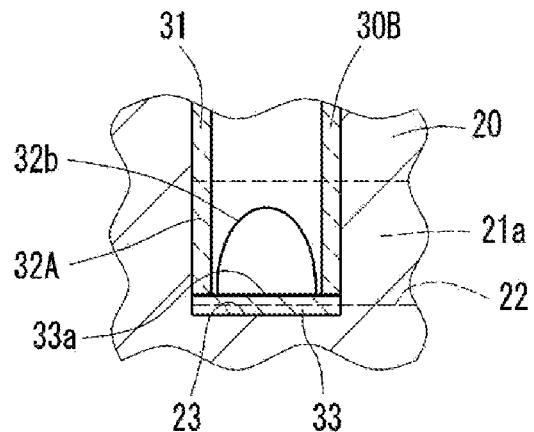
FIG. 5 is an enlarged cross-sectional view of an area including an extension portion in a fourth embodiment.

A fourth embodiment will now be described. FIG. 5 is an enlarged cross-sectional view of an area including an extension portion in the fourth embodiment. The present embodiment is the same as the third embodiment except the structure of the first portion 21a. The same components as in the third embodiment are given the same reference numerals and will not be described. The first portion 21a in the present embodiment has a recess 23 receiving the bottom portion 33 opposite to a position at which the first portion 21a is connected to the second portion 21b. An inner surface 33a of the bottom portion 33 is closer to the bonding surface 20a than the bottom surface 22 of the first portion 21a is to the bonding surface 20a.

With the bottom portion 33 fitted inside the recess 23, the extension portion 32A extending to the first portion 21a is fixed. The inner surface 33a of the bottom portion 33 is located above the bottom surface 22 of the first portion 21a to cover an inner surface of the recess 23. This prevents the inner surface of the recess 23 from being uncovered from the cutouts 32b. This structure thus can reduce electric discharge in the first portion 21a particularly on the inner surface of the recess 23.

Figure 6:
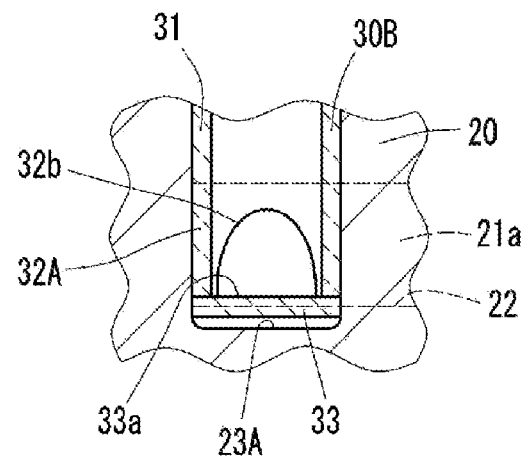
FIG. 6 is an enlarged cross-sectional view of an area including an extension portion in a fifth embodiment.

A fifth embodiment will now be described. FIG. 6 is an enlarged cross-sectional view of an area including an extension portion in the fifth embodiment. The present embodiment is the same as the fourth embodiment except the structure of the first portion 21a. The same components as in the fourth embodiment are given the same reference numerals and will not be described. The first portion 21a in the present embodiment has a recess 23A as in the fourth embodiment. The recess 23A has curved corners.

With the corners of the recess being squared (right-angled), an electric field concentrates in the squared portions and electric discharge is more likely to occur. In the present embodiment, the corners of the recess 23A are curved. This structure reduces the concentration of the electric field and electric discharge on the inner surface of the recess 23A.

Figure 7:
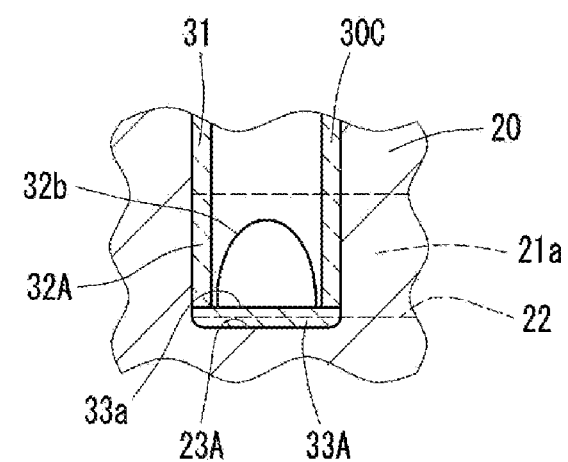
FIG. 7 is an enlarged cross-sectional view of an area including an extension portion in a sixth embodiment.

A sixth embodiment will now be described. FIG. 7 is an enlarged cross-sectional view of an area including an extension portion in the sixth embodiment. The present embodiment is the same as the fifth embodiment except the structure of a cylindrical member 30C. The same components as in the fifth embodiment are given the same reference numerals and will not be described. The first portion 21a in the present embodiment has the recess 23A having curved corners as in the fifth embodiment. A bottom portion 33A has curved corners.

In the present embodiment, for example, the corners of the bottom portion 33A are curved along the corners of the recess 23A. The bottom portion 33A is fitted inside the recess 23A to cause an outer surface of the bottom portion 33A and an inner surface of the recess 23A to be in contact with each other. The inner surface of the recess 23A is then covered to reduce electric discharge.

Figure 8:
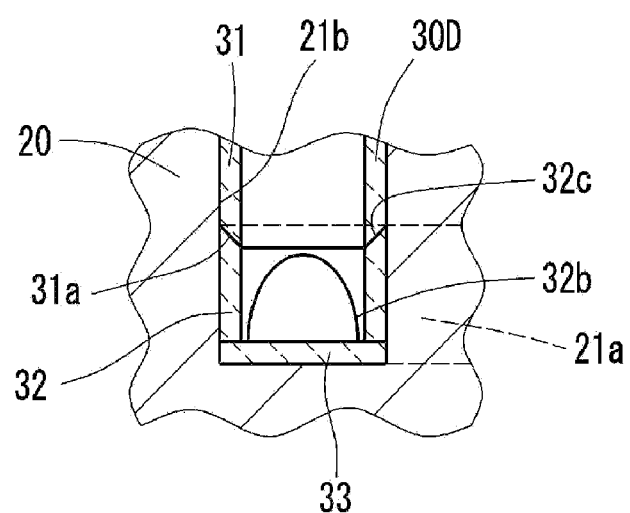
FIG. 8 is an enlarged cross-sectional view of an area including an extension portion in a seventh embodiment.

A seventh embodiment will now be described. FIG. 8 is an enlarged cross-sectional view of an area including an extension portion in the seventh embodiment. The present embodiment is the same as the third embodiment except the structure of a cylindrical member 30D. The same components as in the third embodiment are given the same reference numerals and will not be described. The cylindrical member 30D according to the present embodiment includes a body portion 31 and an extension portion 32 that are separate from each other.

The body portion 31 and the extension portion 32 may be formed from the same insulating material or from different insulating materials. The body portion 31 and the extension portion 32 may be fixed with, for example, an adhesive.

The body portion 31 has an end face 31a, and the extension portion 32 has an end face 32c. The end faces 31a and 32c face each other. The end faces 31a and 32c intersect with an imaginary plane perpendicular to the axial direction. As shown in FIG. 8, for example, the end face 31a of the body portion 31 and the end face 32c of the extension portion 32 in the present embodiment are both inclined with respect to the axial direction of the cylindrical member 30D. More specifically, the end face 31a of the body portion 31 is a slope facing outward in the radial direction. The end face 32c of the extension portion 32 is a slope facing inward in the radial direction.

The creeping distance from an internal space of the cylindrical member 30D through which the plasma generating gas flows to the inner peripheral surface of the first portion 21a and the inner peripheral surface of the second portion 21b is increased, thus reducing electric discharge.

Figure 9:
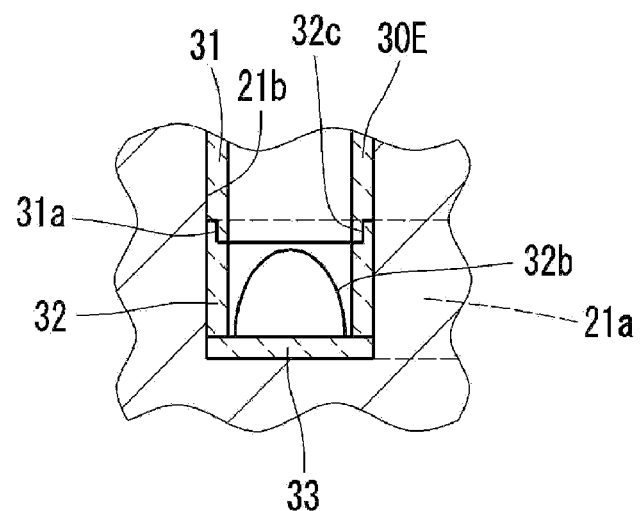
FIG. 9 is an enlarged cross-sectional view of an area including an extension portion in an eighth embodiment.

An eighth embodiment will now be described. FIG. 9 is an enlarged cross-sectional view of an area including an extension portion in the eighth embodiment. The present embodiment is the same as the seventh embodiment except the structure of a cylindrical member 30E. The same components as in the seventh embodiment are given the same reference numerals and will not be described. The cylindrical member 30E in the present embodiment includes a body portion 31 and an extension portion 32 having end faces facing each other. The end faces each include a portion parallel to the axial direction.

As shown in FIG. 9, for example, an end face 31a of the body portion 31 and an end face 32c of the extension portion 32 in the present embodiment are both stepped surfaces. More specifically, the end face 31a of the body portion 31 is a stepped surface that is higher radially inward. The end face 32c of the extension portion 32 is a stepped surface that is higher radially outward. The surface between the radially outward surface and the radially inward surface is parallel to the axial direction.

The creeping distance from an internal space of the cylindrical member 30E through which the plasma generating gas flows to the inner peripheral surface of the first portion 21a and the inner peripheral surface of the second portion 21b is greater than in the seventh embodiment. This can reduce electric discharge.

The gas flow channel 21 in the base 20 may have any shapes different from the shapes described in the above embodiments. For example, the first portion 21a may not be annular, but may be rectangular, comb-shaped, or meandering. The second portions 21b may not be arranged at equal intervals, but may be arranged randomly. The third portion 21c and the fourth portion 21d may be modified as appropriate. For example, the cylindrical member 30 may not be cylindrical, but may be polygonal. The body portion 31 and the extension portion 32 of the cylindrical member 30 may have the same shape or different shapes.

The present disclosure may be implemented in the following forms.

A workpiece holding tool according to one or more embodiments of the present disclosure includes a substrate being a plate having a workpiece holding surface, and a base having a bonding surface bonded to a back surface of the substrate opposite to the workpiece holding surface. The base includes a flow channel extending at least to the bonding surface. The flow channel includes a first portion and a second portion. The first portion extends parallel to the bonding surface of the base. The second portion forms branch connection with the first portion and extends perpendicularly to the bonding surface to be open in the bonding surface. The workpiece holding tool includes a cylindrical member including a body portion being cylindrical and an extension portion being cylindrical. The body portion is located along the second portion. The extension portion is continuous with the body portion and extends to the first portion.

The workpiece holding tool according to one or more embodiments of the present disclosure may include the cylindrical member having the extension portion to reduce electric discharge in the base.

Although embodiments of the present disclosure have been described in detail, the present disclosure is not limited to the embodiments described above, and may be changed or modified in various manners without departing from the spirit and scope of the present disclosure. The components described in the above embodiments may be entirely or partially combined as appropriate unless any contradiction arises.

REFERENCE SIGNS LIST 10 substrate
10a first surface
10b second surface
11 through-hole
20 base
20a first surface
20b second surface
21 gas flow channel
21a first portion
21b second portion
21c third portion
21d fourth portion
22 bottom surface
23 recess
23A recess
30 cylindrical member
30A cylindrical member
30B cylindrical member
30C cylindrical member
30D cylindrical member
30E cylindrical member
31 body portion
31a end face
32 extension portion
32A extension portion
32a distal end
32c end face
33 bottom portion
33A bottom portion
33a inner surface
40 attraction electrode
50 bonding layer
100 workpiece holding tool

The invention claimed is:

1. A workpiece holding tool comprising:
a substrate having a plate, and comprising a workpiece holding surface;
a base comprising:
    a bonding surface bonded to a back surface of the substrate opposite to the workpiece holding surface; and
    a flow channel extending to the bonding surface, the flow channel comprising:
        a first portion extending parallel to the bonding surface of the base, and
        a second portion forming a branch connection with the first portion, comprising an opening at the bonding surface, and extending in a direction perpendicularly to the bonding surface; and
a cylindrical member including
    a body portion being cylindrical located along the second portion and
    an extension portion being cylindrical being continuous with the body portion and extending to the first portion, wherein:
the extension portion comprises a through-hole or cutouts allowing communication between an internal space of the extension portion and the first portion,
the cylindrical member further comprises a bottom portion covering a distal end of the extension portion,
the first portion comprises a recess receiving the bottom portion opposite to a position at which the first portion is connected to the second portion, and
an inner surface of the bottom portion is closer to the bonding surface than a bottom surface of the first portion is to the bonding surface.

2. The workpiece holding tool according to claim 1, wherein the recess has a curved corner.

3. The workpiece holding tool according to claim 1, wherein the bottom portion has a curved corner.

4. A workpiece holding tool comprising:
a substrate having a plate, and comprising a workpiece holding surface;
a base comprising:
- a bonding surface bonded to a back surface of the substrate opposite to the workpiece holding surface; and
- a flow channel extending to the bonding surface, the flow channel comprising:
  - a first portion extending parallel to the bonding surface of the base, and
  - a second portion forming a branch connection with the first portion, comprising an opening at the bonding surface, and extending in a direction perpendicularly to the bonding surface; and a cylindrical member including
- a body portion being cylindrical located along the second portion and an extension portion being cylindrical being continuous with the body portion and extending to the first portion, wherein the body portion and the extension portion are separate from each other, the body portion and the extension portion include end faces facing each other, and the end faces each intersect with an imaginary plane perpendicular to an axial direction.

5. The workpiece holding tool according to claim 4, wherein the end faces each include a portion parallel to the axial direction.

\* \* \* \* \*